United States Patent
Koczwara et al.

(10) Patent No.: US 9,293,870 B1
(45) Date of Patent: Mar. 22, 2016

(54) ELECTRONIC CONTROL MODULE HAVING A COVER ALLOWING FOR INSPECTION OF RIGHT ANGLE PRESS-FIT PINS

(71) Applicant: Continental Automotive Systems, Inc., Auburn Hills, MI (US)

(72) Inventors: Lukasz Koczwara, Bloomingdale, IL (US); James D Baer, Gurnee, IL (US); Edward Hribar, Palos Hills, IL (US); Raymond Lewandowski, Algonquin, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/643,318

(22) Filed: Mar. 10, 2015

(51) Int. Cl.
  *H01R 13/66* (2006.01)
  *H01R 24/60* (2011.01)
  *H01R 13/73* (2006.01)
  *H01R 107/00* (2006.01)

(52) U.S. Cl.
  CPC ............. *H01R 13/665* (2013.01); *H01R 13/73* (2013.01); *H01R 24/60* (2013.01); *H01R 2107/00* (2013.01); *H01R 2201/26* (2013.01)

(58) Field of Classification Search
  CPC ... H05K 5/0052; H05K 5/062; H05K 5/0069; H01R 13/665
  See application file for complete search history.

(56) References Cited

U.S. PATENT DOCUMENTS

| | | | | |
|---|---|---|---|---|
| 4,047,242 A * | 9/1977 | Jakob | .................. | H05K 7/1417 361/709 |
| 4,811,165 A * | 3/1989 | Currier | .................. | H01R 23/70 361/716 |
| 5,392,197 A * | 2/1995 | Cuntz | .................. | H05K 5/0047 174/377 |
| 5,473,109 A * | 12/1995 | Plankl | .................. | H05K 5/0047 174/363 |
| 5,548,481 A * | 8/1996 | Salisbury | ............ | H05K 7/20854 174/16.3 |
| 5,586,389 A * | 12/1996 | Hirao | .................. | H01L 21/4842 257/E23.066 |
| 5,646,827 A * | 7/1997 | Hirao | ................ | H01L 23/49811 257/E23.066 |
| 5,657,203 A * | 8/1997 | Hirao | .................. | H01L 21/4842 257/E23.066 |
| 5,703,754 A * | 12/1997 | Hinze | ................. | B60R 16/0239 174/562 |

(Continued)

*Primary Examiner* — Ross Gushi

(57) ABSTRACT

An electronic control module which has a housing, a cavity formed as part of the housing, and a connector. The control module also includes a plurality of pins, and a portion of the housing is integrally formed around the pins such that a first end of each of the pins are part of the connector, and a second end of each of the pins is located in the cavity. The control module also has a cover with a large portion and a small portion. A sealant is disposed between part of the cover and the housing to provide a seal between the cover and the housing. The small portion of the cover is bendable relative to the large portion to allow an inspection of the pins after the pins are press-fitted into the circuit board as the cover is connected to the housing.

21 Claims, 5 Drawing Sheets

(56) References Cited

U.S. PATENT DOCUMENTS

| | | | | |
|---|---|---|---|---|
| 5,814,765 | A * | 9/1998 | Bauer | H05K 5/061 174/50.54 |
| 5,978,226 | A * | 11/1999 | Thomas | H05K 7/20854 361/707 |
| 6,034,876 | A * | 3/2000 | Ohno | H01R 9/18 361/736 |
| 6,180,045 | B1 * | 1/2001 | Brandenburg | H05K 3/0061 264/263 |
| 6,195,263 | B1 * | 2/2001 | Aoike | H01R 23/70 29/856 |
| 6,265,659 | B1 * | 7/2001 | Kaiser | B60R 16/0239 174/50.51 |
| 6,307,749 | B1 * | 10/2001 | Daanen | H05K 3/284 174/50.5 |
| 6,343,953 | B2 * | 2/2002 | Nakamura | H01R 9/226 439/559 |
| 6,407,925 | B1 * | 6/2002 | Kobayashi | H05K 5/062 200/61.88 |
| 6,430,054 | B1 * | 8/2002 | Iwata | H05K 7/026 174/560 |
| 6,434,013 | B2 * | 8/2002 | Kitamura | H01R 9/226 174/50 |
| 6,493,232 | B2 * | 12/2002 | Skofljanec | H05K 5/006 361/737 |
| 6,522,528 | B2 * | 2/2003 | Yamane | B60R 16/0238 361/601 |
| 6,552,911 | B1 * | 4/2003 | Haupt | B23K 26/28 174/50 |
| 6,573,448 | B2 * | 6/2003 | Mayer | H05K 5/061 174/481 |
| 6,628,523 | B2 * | 9/2003 | Kobayashi | H05K 5/0047 361/736 |
| 6,707,678 | B2 * | 3/2004 | Kobayashi | H05K 5/062 361/752 |
| 6,709,291 | B1 * | 3/2004 | Wallace | H05K 5/0034 439/607.01 |
| 6,717,051 | B2 * | 4/2004 | Kobayashi | B60R 16/0239 174/535 |
| 6,724,627 | B2 * | 4/2004 | Onizuka | B60R 16/0238 165/185 |
| 6,728,110 | B2 * | 4/2004 | Koyama | H05K 5/0073 361/752 |
| 6,757,155 | B2 * | 6/2004 | Koike | H05K 5/062 174/564 |
| 6,773,272 | B2 * | 8/2004 | Koehler | H01R 12/724 439/620.01 |
| 6,870,097 | B2 * | 3/2005 | Oda | B60R 16/0238 174/50 |
| 6,881,077 | B2 * | 4/2005 | Throum | H05K 5/0052 174/16.3 |
| 6,924,985 | B2 * | 8/2005 | Kawakita | H05K 7/20854 257/711 |
| 6,926,540 | B1 * | 8/2005 | Juntwait | H01R 12/585 439/276 |
| 6,927,337 | B2 * | 8/2005 | Kobayashi | B60R 16/0239 174/535 |
| 6,964,575 | B1 * | 11/2005 | Sailor | H01R 13/5202 439/76.1 |
| 7,078,620 | B2 * | 7/2006 | Ikeda | B60R 11/02 174/50 |
| 7,080,990 | B1 * | 7/2006 | Juntwait | H01R 12/724 439/76.1 |
| 7,081,691 | B2 * | 7/2006 | Kawata | H05K 1/0203 307/9.1 |
| 7,094,075 | B1 * | 8/2006 | Lim | H01R 12/7005 439/76.1 |
| 7,099,155 | B2 * | 8/2006 | Kobayashi | B60R 16/0238 165/80.3 |
| 7,110,246 | B2 * | 9/2006 | Tsunooka | H01R 13/33 361/637 |
| 7,120,024 | B2 * | 10/2006 | Watanabe | H05K 7/20854 165/185 |
| 7,120,030 | B2 * | 10/2006 | Azumi | B60R 16/0239 361/736 |
| 7,144,275 | B2 * | 12/2006 | Iida | H05K 5/062 439/587 |
| 7,151,674 | B2 * | 12/2006 | Sasaki | B60R 16/0239 174/521 |
| 7,184,273 | B2 * | 2/2007 | Sakai | H05K 5/0039 361/728 |
| 7,189,082 | B2 * | 3/2007 | Fukushima | H01R 9/245 174/50 |
| 7,209,360 | B1 * | 4/2007 | Yarza | H05K 5/064 174/520 |
| 7,209,367 | B2 * | 4/2007 | Nakano | H05K 3/3405 361/775 |
| 7,227,757 | B2 * | 6/2007 | Mizutani | H01R 13/5202 174/59 |
| 7,230,821 | B2 * | 6/2007 | Skofljanec | H05K 5/0039 312/223.1 |
| 7,233,495 | B2 * | 6/2007 | Tomikawa | H05K 3/284 165/80.2 |
| 7,244,141 | B2 * | 7/2007 | Yamane | H05K 7/026 361/719 |
| 7,249,957 | B2 * | 7/2007 | Watanabe | H01R 12/7064 439/79 |
| 7,331,801 | B1 * | 2/2008 | Eichorn | H01R 12/724 439/76.1 |
| 7,408,765 | B2 * | 8/2008 | Kanou | H05K 7/026 361/622 |
| 7,413,445 | B2 * | 8/2008 | Inagaki | B60R 16/0239 439/76.1 |
| 7,413,446 | B1 * | 8/2008 | Jilg | H01R 12/724 439/76.1 |
| 7,419,385 | B2 * | 9/2008 | Itou | H01R 12/724 439/76.1 |
| 7,556,510 | B2 * | 7/2009 | Tsuruzawa | H05K 3/303 439/79 |
| 7,561,435 | B2 * | 7/2009 | Kamoshida | H05K 5/062 174/50.5 |
| 7,563,992 | B2 * | 7/2009 | Lawlyes | H05K 9/0073 174/561 |
| 7,616,448 | B2 * | 11/2009 | Degenkolb | H05K 3/284 174/50.5 |
| 7,632,110 | B2 * | 12/2009 | Kanou | H02G 3/086 361/704 |
| 7,643,297 | B2 * | 1/2010 | Tominaga | B62D 5/0406 165/80.2 |
| 7,667,971 | B2 * | 2/2010 | Tominaga | B62D 5/0406 361/706 |
| 7,667,973 | B2 * | 2/2010 | Shinoda | H05K 5/0047 174/50 |
| 7,679,923 | B2 * | 3/2010 | Inagaki | H05K 3/284 174/521 |
| 7,697,300 | B2 * | 4/2010 | Brandt | B60R 16/0239 361/704 |
| 7,699,622 | B2 * | 4/2010 | Sakamoto | H01R 13/629 439/76.1 |
| 7,719,833 | B2 * | 5/2010 | Inagaki | B60R 16/0239 165/80.3 |
| 7,736,158 | B2 * | 6/2010 | Yamaguchi | H05K 7/026 439/271 |
| 7,744,381 | B2 * | 6/2010 | Honda | H05K 5/0052 439/79 |
| 7,751,193 | B2 * | 7/2010 | Tominaga | H05K 3/32 165/185 |
| 7,755,907 | B2 * | 7/2010 | Inagaki | B60R 16/0239 174/50.5 |
| 7,782,628 | B2 * | 8/2010 | Sakamoto | H05K 1/144 174/521 |
| 7,791,888 | B2 * | 9/2010 | Tominaga | B60R 16/0239 165/185 |
| 7,835,141 | B2 * | 11/2010 | Sasaki | H05K 7/026 174/50 |
| 7,877,868 | B2 * | 2/2011 | Tomikawa | H05K 3/284 156/292 |
| 7,883,373 | B2 * | 2/2011 | Drew | H01R 13/5219 439/485 |
| 7,916,491 | B2 * | 3/2011 | Fino | H05K 7/20454 174/520 |
| 7,931,478 | B2 * | 4/2011 | Yamaguchi | H05K 7/026 361/752 |

(56) References Cited

U.S. PATENT DOCUMENTS

| | | | | |
|---|---|---|---|---|
| 7,936,566 B2* | 5/2011 | Shigyo | H05K 5/0052 | 137/14 |
| 7,978,459 B2* | 7/2011 | Nakanishi | H02G 3/088 | 361/622 |
| 8,014,158 B2* | 9/2011 | Kojima | H05K 5/0052 | 174/50.5 |
| 8,023,273 B2* | 9/2011 | Chlumsky | H05K 5/006 | 174/50.52 |
| 8,107,251 B2* | 1/2012 | Yamauchi | H05K 5/0069 | 361/730 |
| 8,139,364 B2* | 3/2012 | Wickett | H05K 5/0039 | 174/50 |
| 8,184,438 B2* | 5/2012 | Kaneko | H05K 7/026 | 165/80.2 |
| 8,305,763 B2* | 11/2012 | Kato | H05K 5/006 | 361/730 |
| 8,338,721 B2* | 12/2012 | Bardia | H05K 5/0026 | 174/560 |
| 8,356,762 B2* | 1/2013 | Tomikawa | B60R 16/0239 | 165/185 |
| 8,357,015 B2* | 1/2013 | Kohmura | B29C 45/14311 | 361/752 |
| 8,488,324 B2* | 7/2013 | Becker | H05K 5/0082 | 165/80.2 |
| 8,505,891 B2* | 8/2013 | Guyenot | H05K 5/0052 | 206/219 |
| 8,520,397 B2* | 8/2013 | Azumi | H05K 5/0052 | 361/730 |
| 8,523,581 B2* | 9/2013 | Martin | H01R 12/724 | 439/83 |
| 8,627,564 B2* | 1/2014 | Blossfeld | H01R 43/18 | 29/592.1 |
| 8,657,609 B2* | 2/2014 | Yanagisawa | H05K 5/0056 | 439/79 |
| 8,670,240 B2* | 3/2014 | Hashimoto | H05K 5/0052 | 361/704 |
| 8,687,374 B2* | 4/2014 | Watanabe | H05K 5/0052 | 361/752 |
| 8,699,231 B2* | 4/2014 | Shinoda | H05K 5/0047 | 174/520 |
| 8,727,794 B2* | 5/2014 | Tanaka | H05K 5/0039 | 361/752 |
| 8,770,989 B2* | 7/2014 | Ohhashi | H01R 13/5202 | 439/589 |
| 8,780,564 B2* | 7/2014 | Yanai | B60T 13/686 | 137/557 |
| 8,824,151 B2* | 9/2014 | Ghannam | B60R 16/0239 | 361/728 |
| 8,830,686 B2* | 9/2014 | Nomoto | H05K 5/0073 | 361/752 |
| 8,845,340 B2* | 9/2014 | Nakanishi | H01R 43/18 | 439/76.1 |
| 8,885,343 B2* | 11/2014 | Lischeck | H05K 7/20454 | 165/80.2 |
| 8,904,633 B2* | 12/2014 | Blossfeld | H01R 43/18 | 29/592.1 |
| 8,908,380 B2* | 12/2014 | Ohhashi | H05K 5/0052 | 174/535 |
| 8,942,001 B2* | 1/2015 | Kawai | H05K 5/0052 | 174/50.5 |
| 9,013,889 B2* | 4/2015 | Tamura | H05K 5/0052 | 361/752 |
| 9,017,082 B2* | 4/2015 | Makino | H02G 3/088 | 439/76.2 |
| 9,065,222 B2* | 6/2015 | Drew | H01R 12/71 | |
| 9,077,098 B2* | 7/2015 | Latunski | H01R 13/521 | |
| 9,078,367 B2* | 7/2015 | Tamura | H05K 5/0052 | |
| 9,093,776 B2* | 7/2015 | Yamanaka | H05K 5/0069 | |
| 9,101,066 B2* | 8/2015 | Azumi | H05K 5/069 | |
| 9,105,996 B2* | 8/2015 | Falchi | F01L 9/04 | |
| 2001/0017766 A1* | 8/2001 | Murowaki | H05K 1/147 | 361/752 |
| 2001/0021103 A1* | 9/2001 | Takagi | B62D 5/0406 | 361/752 |
| 2001/0039131 A1* | 11/2001 | Murakami | H01R 9/226 | 439/76.2 |
| 2002/0112870 A1* | 8/2002 | Kobayashi | H05K 5/062 | 174/50 |
| 2002/0141143 A1* | 10/2002 | Yamane | B60R 16/0238 | 361/601 |
| 2002/0154486 A1* | 10/2002 | Koike | H05K 5/0073 | 361/704 |
| 2003/0048611 A1* | 3/2003 | Skofljanec | B60R 16/0239 | 361/704 |
| 2003/0133267 A1* | 7/2003 | Beihoff | B60L 11/12 | 361/704 |
| 2003/0147204 A1* | 8/2003 | Koike | H05K 5/062 | 361/600 |
| 2003/0147217 A1* | 8/2003 | Koike | H05K 7/142 | 361/715 |
| 2003/0161110 A1* | 8/2003 | Spasevski | H05K 7/20854 | 361/715 |
| 2003/0169572 A1* | 9/2003 | Jakob | H05K 5/0069 | 361/752 |
| 2003/0206392 A1* | 11/2003 | Kawata | H05K 1/0203 | 361/631 |
| 2004/0004816 A1* | 1/2004 | Yamaguchi | H05K 3/284 | 361/695 |
| 2004/0014356 A1* | 1/2004 | Hallitschke | H05K 5/0069 | 439/527 |
| 2004/0095732 A1* | 5/2004 | Azumi | B60R 16/0239 | 361/752 |
| 2004/0141292 A1* | 7/2004 | Onizuka | B60R 16/0238 | 361/704 |
| 2004/0160731 A1* | 8/2004 | Yamaguchi | B60R 16/0238 | 361/600 |
| 2004/0223304 A1* | 11/2004 | Kobayashi | B60R 16/0238 | 361/715 |
| 2004/0235317 A1* | 11/2004 | Schiefer | H05K 1/181 | 439/76.2 |
| 2005/0020104 A1* | 1/2005 | Yamamoto | H01R 13/4361 | 439/76.1 |
| 2005/0047095 A1* | 3/2005 | Tomikawa | H05K 3/284 | 361/715 |
| 2005/0068750 A1* | 3/2005 | Origlia | H05K 5/0056 | 361/752 |
| 2005/0088826 A1* | 4/2005 | Throum | H05K 5/0052 | 361/719 |
| 2005/0105253 A1* | 5/2005 | Sakai | H05K 5/0039 | 361/752 |
| 2005/0190539 A1* | 9/2005 | Watanabe | H05K 7/20854 | 361/704 |
| 2006/0012034 A1* | 1/2006 | Kadoya | H05K 1/0203 | 257/712 |
| 2006/0067058 A1* | 3/2006 | Kita | B60R 16/0239 | 361/710 |
| 2006/0171127 A1* | 8/2006 | Kadoya | B29C 45/14377 | 361/752 |
| 2006/0181859 A1* | 8/2006 | Thorum | H05K 5/0052 | 361/719 |
| 2006/0289664 A1* | 12/2006 | Tomikawa | B60R 16/0239 | 237/12.3 R |
| 2007/0072452 A1* | 3/2007 | Inagaki | B60R 16/0239 | 439/76.2 |
| 2007/0076383 A1* | 4/2007 | Sasaki | H05K 5/063 | 361/752 |
| 2007/0077828 A1* | 4/2007 | Kurahashi | H01R 43/24 | 439/884 |
| 2007/0109730 A1* | 5/2007 | Shigyo | H05K 5/0052 | 361/600 |
| 2007/0134981 A1* | 6/2007 | Shinoda | H05K 5/0047 | 439/587 |
| 2007/0147017 A1* | 6/2007 | Eom | H05K 1/141 | 361/809 |
| 2007/0164475 A1* | 7/2007 | Nagashima | B29C 45/0046 | 264/259 |
| 2007/0195504 A1* | 8/2007 | Tomikawa | H05K 3/284 | 361/715 |
| 2007/0230137 A1* | 10/2007 | Inagaki | B60R 16/0239 | 361/719 |
| 2008/0045061 A1* | 2/2008 | Hayashi | H01R 13/5202 | 439/246 |

(56) References Cited

U.S. PATENT DOCUMENTS

| | | | |
|---|---|---|---|
| 2008/0066956 A1* | 3/2008 | Lawlyes | H05K 5/062 174/535 |
| 2008/0074840 A1* | 3/2008 | Suzuki | H05K 5/0047 361/679.46 |
| 2008/0080147 A1* | 4/2008 | Steele | H05K 7/1417 361/736 |
| 2008/0223597 A1* | 9/2008 | Kanou | H02G 3/088 174/50 |
| 2008/0294324 A1* | 11/2008 | Yoshinari | F02D 41/20 701/102 |
| 2008/0310131 A1* | 12/2008 | Fino | H05K 7/20454 361/758 |
| 2009/0068862 A1* | 3/2009 | Honda | H05K 5/0052 439/78 |
| 2009/0086437 A1* | 4/2009 | Tsuyuno | H05K 1/141 361/709 |
| 2009/0268414 A1* | 10/2009 | Lu | B29C 45/14639 361/736 |
| 2009/0298311 A1* | 12/2009 | Nakanishi | H02G 3/088 439/76.2 |
| 2010/0053908 A1* | 3/2010 | Hwang | H05K 1/142 361/741 |
| 2010/0103632 A1* | 4/2010 | Kato | H05K 5/006 361/752 |
| 2010/0254093 A1* | 10/2010 | Oota | B60R 16/0239 361/720 |
| 2011/0216487 A1* | 9/2011 | Sakai | H05K 7/20863 361/679.01 |
| 2011/0235289 A1* | 9/2011 | Watanabe | H05K 5/0052 361/752 |
| 2011/0292624 A1* | 12/2011 | Tanaka | H05K 5/006 361/752 |
| 2013/0003306 A1* | 1/2013 | Oota | B60R 16/0239 361/709 |
| 2013/0033823 A1* | 2/2013 | Nagashima | B60T 7/042 361/714 |
| 2013/0119908 A1* | 5/2013 | Harada | H02P 6/10 318/400.42 |
| 2013/0286606 A1* | 10/2013 | Watanabe | H05K 7/1417 361/752 |
| 2013/0313753 A1* | 11/2013 | Scheel | B29C 45/14549 264/272.14 |
| 2013/0335919 A1* | 12/2013 | Shinoda | H05K 5/0047 361/694 |
| 2013/0343018 A1* | 12/2013 | Hattori | H05K 5/0026 361/755 |
| 2013/0343030 A1* | 12/2013 | Hattori | H05K 5/0004 361/824 |
| 2014/0085839 A1* | 3/2014 | Nakano | H05K 5/0052 361/752 |
| 2014/0092570 A1* | 4/2014 | Blossfeld | H01R 43/18 361/752 |
| 2014/0112015 A1* | 4/2014 | Kurebayashi | H05K 1/0204 362/547 |
| 2014/0118986 A1* | 5/2014 | Suzuki | H05K 5/0056 361/821 |
| 2014/0144666 A1* | 5/2014 | Lisitschew | H05K 5/0004 174/50 |
| 2014/0218862 A1* | 8/2014 | Hashikura | B60R 16/0238 361/688 |
| 2014/0240885 A1* | 8/2014 | Kamiya | H05K 1/181 361/93.8 |
| 2014/0285985 A1* | 9/2014 | Tanaka | H05K 5/0069 361/752 |
| 2014/0313675 A1* | 10/2014 | Choo | H05K 13/0023 361/709 |
| 2014/0321079 A1* | 10/2014 | Kim | H05K 5/0039 361/752 |
| 2014/0334104 A1* | 11/2014 | Yang | H05K 5/0047 361/709 |
| 2014/0334115 A1* | 11/2014 | Yang | H05K 5/06 361/752 |
| 2014/0334116 A1* | 11/2014 | Lee | H05K 5/0052 361/752 |
| 2015/0009629 A1* | 1/2015 | Moon | H05K 5/0034 361/709 |
| 2015/0146347 A1* | 5/2015 | Lee | H01R 13/5202 361/679.01 |
| 2015/0156929 A1* | 6/2015 | Nagashima | B60T 7/042 361/752 |
| 2015/0180157 A1* | 6/2015 | Endo | H01R 13/516 439/571 |
| 2015/0180159 A1* | 6/2015 | Endo | H01R 13/516 439/587 |
| 2015/0189734 A1* | 7/2015 | Nishimoto | H05K 1/0203 701/41 |
| 2015/0250072 A1* | 9/2015 | Ichikawa | H05K 5/063 439/587 |
| 2015/0274197 A1* | 10/2015 | Saito | B62D 5/0406 318/400.29 |
| 2015/0282362 A1* | 10/2015 | Nuriya | H05K 5/061 361/728 |
| 2015/0303596 A1* | 10/2015 | Nagai | H01R 12/58 439/75 |
| 2015/0327354 A1* | 11/2015 | Umeno | H05K 1/0204 361/720 |
| 2015/0331087 A1* | 11/2015 | Philipp | H05K 5/0069 342/175 |
| 2015/0357799 A1* | 12/2015 | Nakashima | H02B 1/48 361/622 |
| 2015/0373867 A1* | 12/2015 | Ochoa Reyes | H05K 5/061 361/736 |

* cited by examiner

ELECTRONIC CONTROL MODULE HAVING A COVER ALLOWING FOR INSPECTION OF RIGHT ANGLE PRESS-FIT PINS

FIELD OF THE INVENTION

The invention relates generally to an electronic control module having right angle press-fit pins, where the module includes a cover having a portion that is bendable to allow for inspection of the pins after the pins are press-fitted into a circuit board.

BACKGROUND OF THE INVENTION

Electronic control modules are generally known, some types of electronic control modules have a group of pins that are shaped to be at a right-angle (ninety degrees) to allow the pins to be positioned such that one end of the pins extend outwardly and are part of a connector, and another end of the pins extends into and are in contact with a circuit board. These modules typically include a housing, where the circuit board, among other components, is located in the housing, and the housing is formed to be molded with the pins, such that a portion of the pins extends into the housing, and a portion of the pins extends out of the housing and are part of the connector.

These modules also typically include a cover, which is assembled to the housing during assembly. Some modules are constructed such that during assembly, the cover is assembled to the housing using fasteners, such as screws. There is also a subassembly, which includes a circuit board laminated onto a cover, and the subassembly is then pressed onto the pins, such that the pins are press-fitted into the circuit board. The screws are then used to permanently attach the cover to the housing. However, during this process, it is difficult to visually validate the resultant press-fit interface between the circuit board and the pins. Some attempts have been made to address this issue by incorporating a separate opening in the cover to allow access to the pins after the cover is attached to the housing, where an additional cover plate, or two, is then attached to the cover after the pins are inspected. But this process is expensive, and requires additional manufacturing steps. These types of covers are typically made of a die cast material, which is expensive, and includes extra components and manufacturing operations due to the cover plates, seals, and screws used to seal the window openings in the die cast. Window openings are required for inspection of the press-fit interface after the circuit board is installed and the pins are press-fit into the board.

Another process that has been used in the assembly of these modules includes the circuit board being placed into the housing such that the pins are press-fitted into the circuit board, and a gap filler is then placed on the circuit board, followed by a seal, and then the cover. This assembly approach requires the circuit board to have a larger surface area due to the use of the gap filler, and is typically assembled using screws that extend through the housing, the circuit board, and into the cover.

Accordingly, there exists a need for an electronic control module which facilitates the connection between the circuit board and the pins during assembly, allows for visual validation of the press-fit interface after connection with the circuit board, and provides a suitable connection between the cover and the housing, while minimizing cost and steps used during the manufacturing process.

SUMMARY OF THE INVENTION

The present invention is an electronic control module which includes a cover having a circuit board, where the cover accommodates the visual validation of the press fit interface after the pins are press-fitted into a circuit board as the cover is assembled to a housing.

In one embodiment, the present invention is an electronic control module which has a housing, a cavity formed as part of the housing, and a connector, where the connector is part of the housing. The control module also includes a plurality of pins, each of which includes a first end and a second end. A portion of the housing is integrally formed around the plurality of pins such that the first end of each of the plurality of pins are part of the connector, and the second end of each of the plurality of pins is located in the cavity. The control module also has a cover with a large portion and a small portion, the small portion being bendable relative to the large portion. An adhesive connects the circuit board to the large portion of the cover, and the small portion of the cover is bendable relative to the large portion to allow an inspection of the plurality of pins after the plurality of pins are press-fitted into the circuit board as the cover is connected to the housing. A sealant is disposed between part of the cover and the housing to provide a seal between the cover and the housing.

The connector includes a shroud integrally formed with the housing, and the first end of each of the plurality of pins extends out of the housing such that the first end of each of the plurality of pins is substantially surrounded by the shroud.

There is at least one mounting feature integrally formed with the housing, and at least one bushing is surrounded by the mounting feature. A fastener is inserted through the bushing to assemble the electronic control module in the engine compartment or other area of a vehicle.

Each of the plurality of pins is configured such that the first end of the plurality of pins is about ninety degrees relative to the second end of each of the plurality of pins. This facilitates the pins being part of the connector, and being connected to the printed circuit board.

In one embodiment, the electronic control module is constructed by creating a sub-assembly which includes a populated circuit board, which in one embodiment may be a printed circuit board (PCB), laminated to a cover with pressure sensitive adhesive or thermally conductive adhesive. A sealant is then dispensed onto a portion of a housing.

The sub-assembly is configured such that a geometry is stamped (coined) into the cover to provide the cover with the small portion that may be bent at least twice without cracking. The geometry also prevents the wet seal path from a seal breech. Because of the geometry coined into the cover, a portion of the cover is positioned such that the press-fit pins may be optically inspected for correct press-fit interface. Once the pins are inspected, the cover is bent flat and screws are used to fasten the cover to the housing.

In one embodiment, the cover is made of metal, and may be an aluminum sheet metal cover, or the cover could be made of a coated steel instead of aluminum. In other embodiments, there are mounting features integrated into the cover with extended material to add metal standoffs.

It is therefore an object of this invention to reduce the cost of an electronic control module by replacing a die cast cover with a more cost effective cover.

It is yet another object of this invention to reduce manufacturing costs by eliminating the processes associated with the extra components required to cover and seal the window openings.

It is yet another object of this invention to reduce size of the electronic control module by eliminating the use of gap filler and the required screws and standoffs, and instead using pressure sensitive adhesive or thermally conductive adhesive to laminate the circuit board to the cover.

It is yet another object of this invention to eliminate the need for a window opening to perform the pin inspection and the extra components used to seal the window opening.

It is yet another object of this invention to eliminate placement of the circuit board onto posts which requires specific pedestal locations and heights to press on the PCB.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
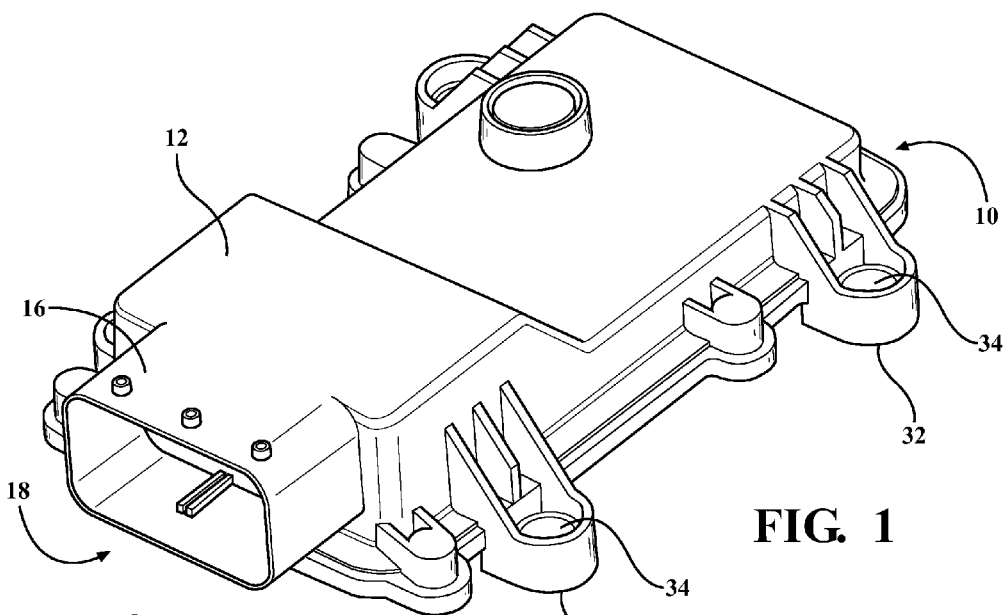
FIG. 1 is a first perspective view of an electronic control module assembly, according to embodiments of the present invention.

The following description of the preferred embodiment(s) is merely exemplary in nature and is in no way intended to limit the invention, its application, or uses.

An electronic control module constructed according to the present invention is shown in the Figures generally at 10. The module 10 includes a housing 12 which includes a cavity, shown generally at 14. Integrally formed with the housing 12 is a shroud 16 which is part of a connector, shown generally at 18. The connector 18 also includes a plurality of pins 20, where the housing 12 is molded around the pins 20 such that a first end 20a of the pins 20 extends out of the housing 12 and is surrounded by the shroud 16, and a second end 20b of each of the pins 20 is located in the housing 12. In this embodiment, the pins 20 are right-angle pins 20, such that the first end 20a of each pin 20 is ninety-degrees relative to the second end 20b of each pin 20. The second end 20b is located in the cavity 14, and is pointed outwardly from the cavity 14, as shown in FIGS. 4-8.

The cavity 14 also includes a shallow portion, shown generally at 14a, and a deep portion, shown generally at 14b, where the pins 20 are primarily located in the deep portion 14b. The housing 12 also includes an outer lip 22 which substantially surrounds the perimeter of the cavity 14. Adjacent the lip 22 is a stepped portion 24 having an inner step and outer step, and during assembly, a sealant 26 is deposited on the inner step of the stepped portion 24. Although a sealant 26 has been described, it is within the scope of the invention that a gasket or other components may be used.

Also formed as part of the housing 12 along the outer lip 22 is a series of threaded apertures 28, which receive fasteners, such as screws 30. There are also mounting features 32 integrally formed with the housing 12 which are used for mounting the module 10 within a vehicle, such as an engine compartment, or the like. The mounting features 32 may optionally include rigid bushings 34, where fasteners, such as screws, may be inserted through the bushings 34 to provide a more rigid connection within the vehicle.

Figure 3:
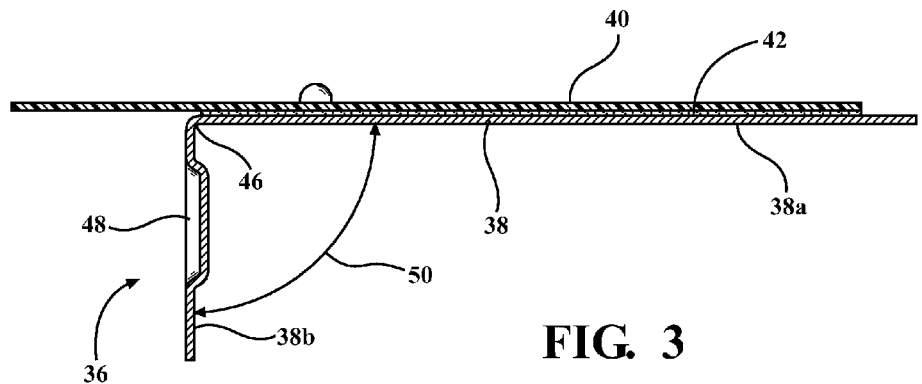
FIG. 3 is a side view of a sub-assembly which is part of an electronic control module assembly, according to embodiments of the present invention.
Figure 4:
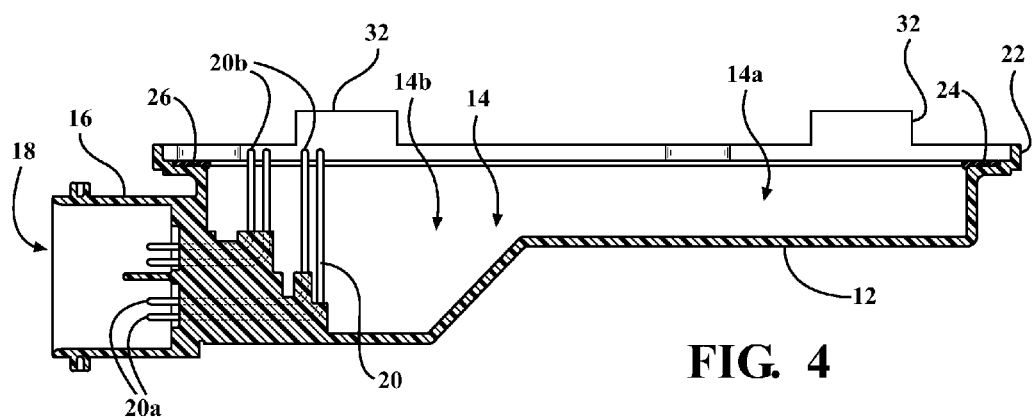
FIG. 4 is a first sectional side view of an electronic control module assembly, according to embodiments of the present invention.
Figure 7:
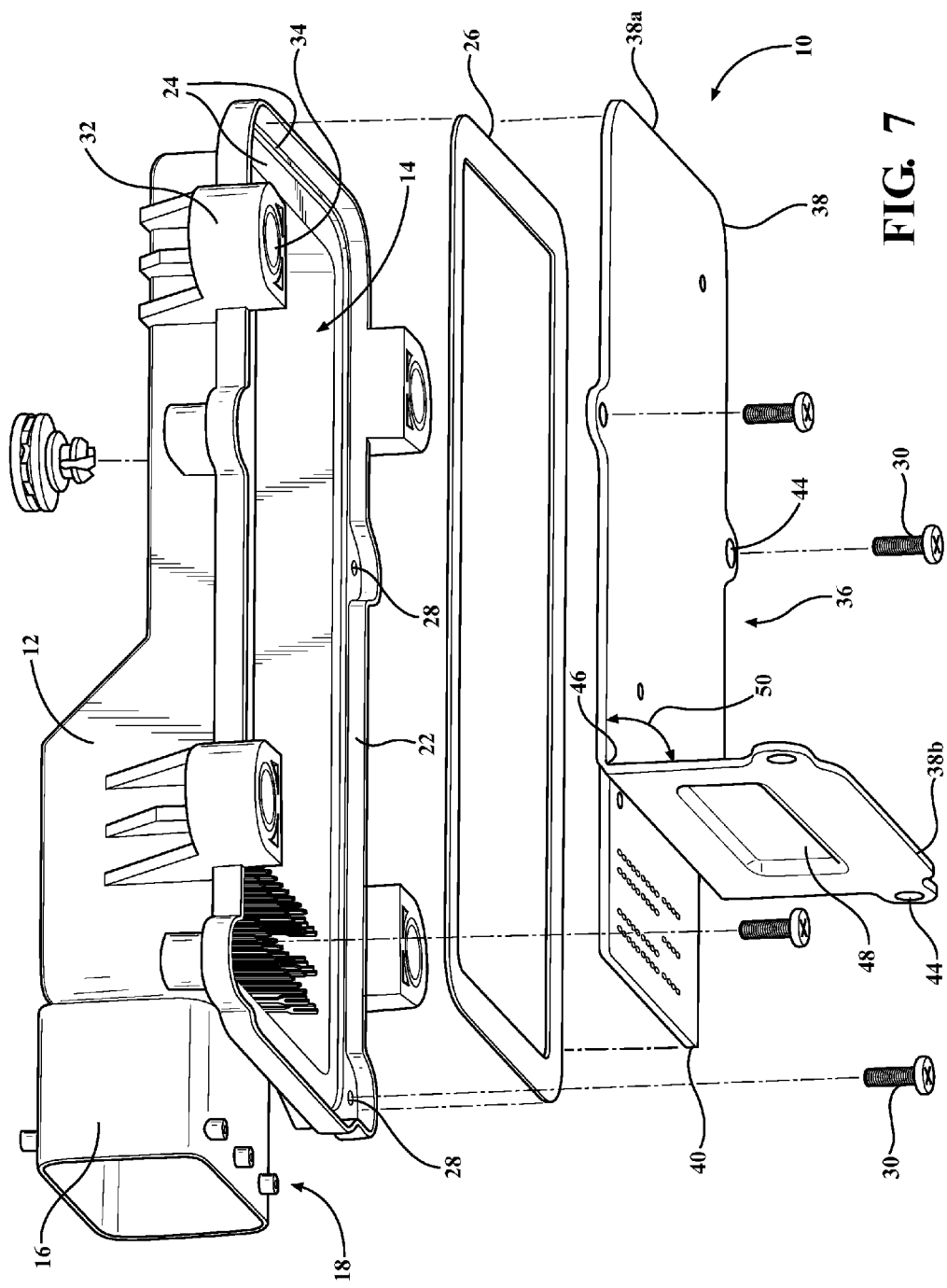
FIG. 7 is an exploded view of an electronic control module assembly, according to embodiments of the present invention.

The module 10 also includes a sub-assembly, shown generally at 36 in FIGS. 3 and 7, which includes a cover 38 and a circuit board, which in this embodiment is a printed circuit board (PCB) 40. The cover 38 includes two portions, a large portion 38a and a small portion 38b. Both portions 38a,b include apertures 44, where during assembly, the screws 30 are inserted through the apertures 44 of the cover 38 and into the threaded apertures 28 of the housing 12. The PCB 40 is attached to the large portion 38a of the cover 38 using an adhesive 42, which in this embodiment may be a pressure sensitive adhesive (PSA) or a thermally conductive adhesive (TCA).

The small portion 38b of the cover 38 moves relative to the large portion 38a because of a joint 46. The small portion 38b also includes a recessed portion 48 which the second end 20b of the pins 20 extend into after the small portion 38b is connected to the housing 12, providing a clearance between the second end 20b of the pins 20 and the cover 38.

During assembly, the housing 12 is molded around the pins 20 such that the pins 20 are configured as shown in the Figures. The sealant 26 is then dispensed onto the inner step of the stepped portion 24. The PCB 40 is then attached to the cover 38 using the adhesive 42 to create the sub-assembly 36. Once the sub-assembly 36 is created, the cover 38 is positioned relative to the housing 12 such that the outer edge of the cover 38 contacts the outer step of the stepped portion 24, part of the sealant 26 is in contact with the large portion 38a, the apertures 44 of the large portion 38a of the cover 38 are aligned with corresponding apertures 28, and screws 30 are inserted through the apertures 44 of the large portion 38a and into the corresponding apertures 28 of the housing 12, securing the cover 38 to the housing 12.

Figure 5:
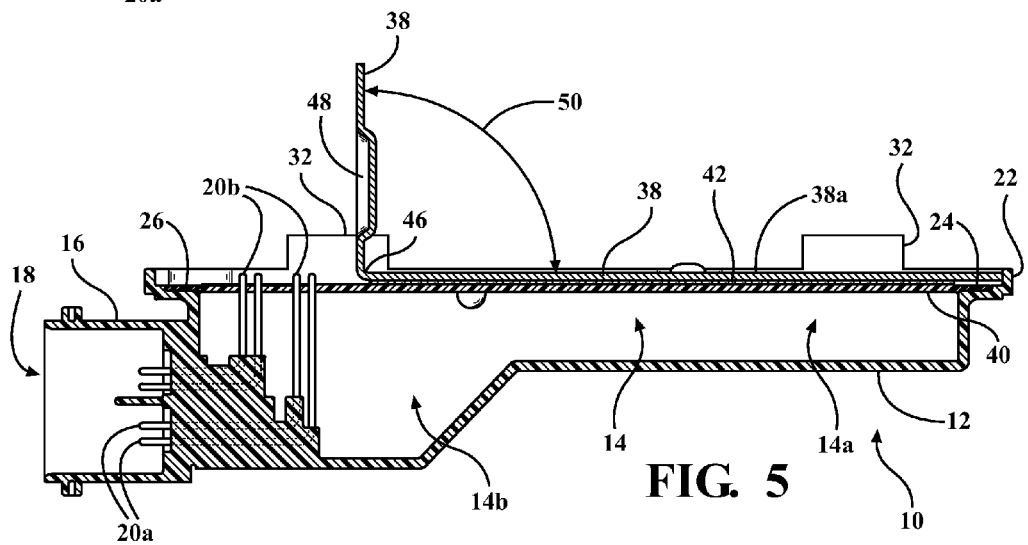
FIG. 5 is a second sectional side view of an electronic control module assembly, according to embodiments of the present invention.
Figure 6:
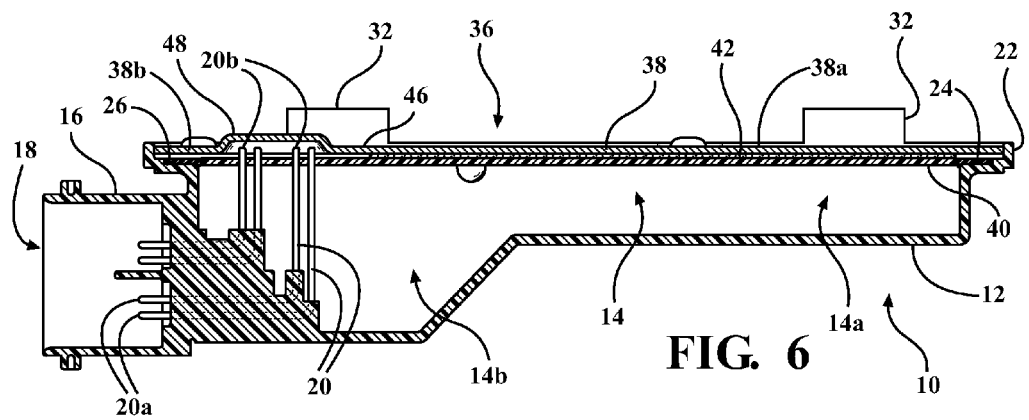
FIG. 6 is a third sectional side view of an electronic control module assembly, according to embodiments of the present invention.
Figure 8:
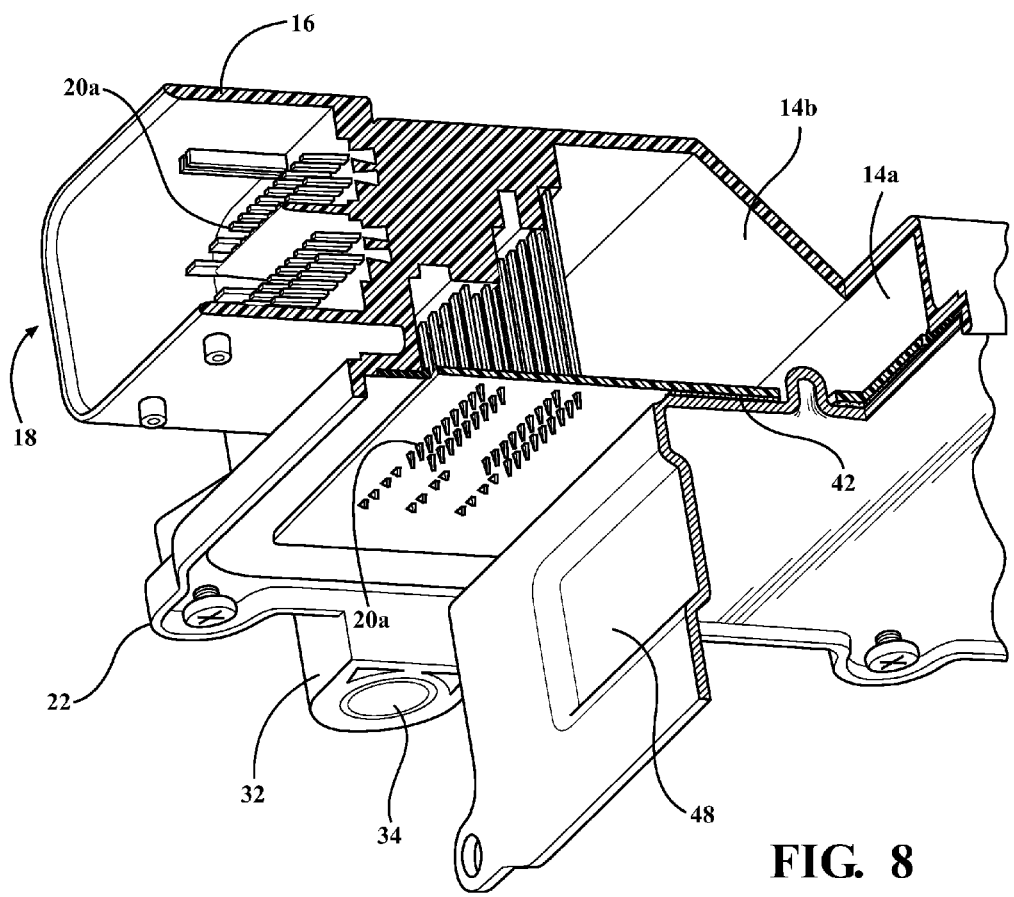
FIG. 8 is a partial sectional view of an electronic control module assembly, according to embodiments of the present invention.

As the large portion 38a of the cover 38 is connected to the housing 12, second end 20b of the pins 20 are press-fitted into the PCB 40 into the position shown in FIGS. 5-6 and 8. During this part of the assembly process, the small portion 38b remains at an angle 50 relative to the large portion 38a as shown in FIGS. 3, 5, and 7-8. In this embodiment, the angle 50 is about ninety degrees, but it is within the scope of the invention that other angles may be used.

Figure 2:
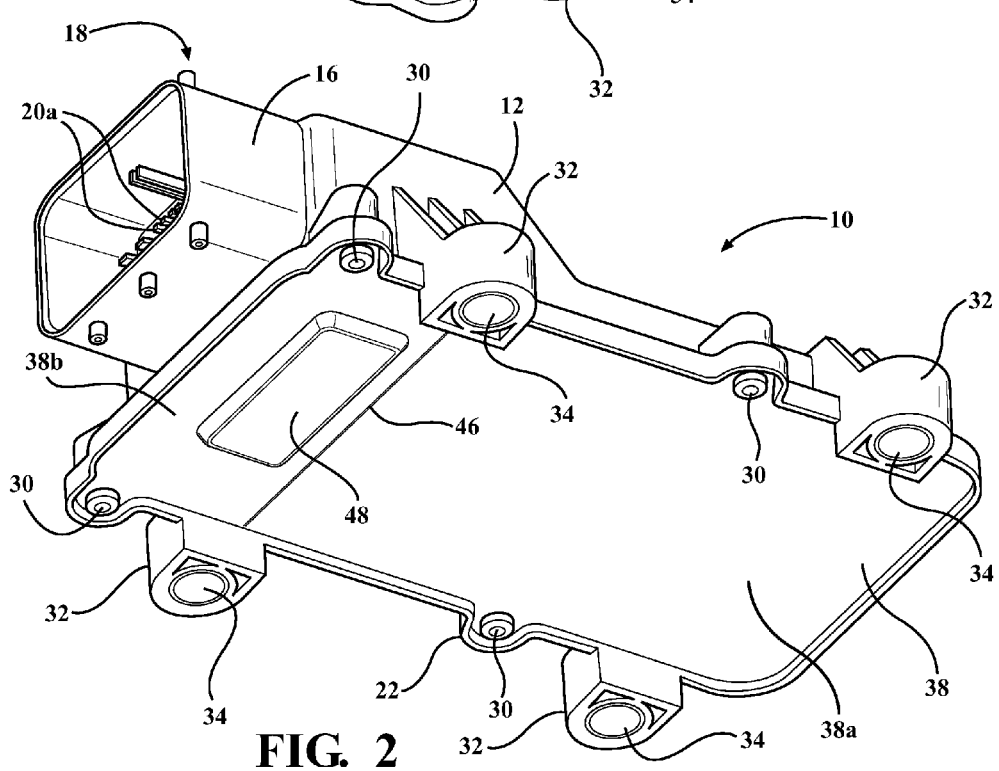
FIG. 2 is a second perspective view of an electronic control module assembly, according to embodiments of the present invention.

After the large portion 38a of the cover 38 is connected to the housing 12, the second end 20b of the pins 20 are press-fitted into the PCB 40, and the pins 20 are inspected to ensure they are positioned correctly relative to the PCB 40. Typically, the height of the pins 20 is inspected to determine if the pins 20 are positioned correctly. This allows the pins 20 to be visually inspected when the PCB 40 is connected to the cover 38, and eliminates the need for a window to be formed as part of the cover 38 to allow for an optical inspection of the pins 20, and eliminates additional components used to seal the window. Once the pins 20 are inspected, and it is verified that the pins 20 are in the correct position, the small portion 38b of the cover 38 is pivoted to place the outer edge of the small portion 38b in contact with the outer step of the stepped portion 24, part of the sealant 26 is in contact with the small portion 38b, and the apertures 44 of the small portion 38b are in alignment with the threaded apertures 28 of the housing 12. Screws 30 are then inserted through the apertures 44 of the small portion 38b and into the threaded apertures 28 of the housing 12, securing the small portion 38b to the housing 12, as shown in FIGS. 2 and 6. Once the small portion 38b is connected to the housing 12, the second end 20b of the pins 20 at least partially extend into the recessed portion 48, as shown in FIG. 6.

The cover 38 is made of a sheet metal material, such as aluminum, as opposed to a die cast material which is more expensive. The joint 46 is typically made of a geometry that is stamped (coined) to allow the small portion 38b of the cover 38 to be bent relative to the large portion 38a at least twice during assembly, such that the small portion 38b may be moved between the position shown in FIGS. 3, 5, and 7-8 and the position shown in FIGS. 2 and 6.

Figure 9:
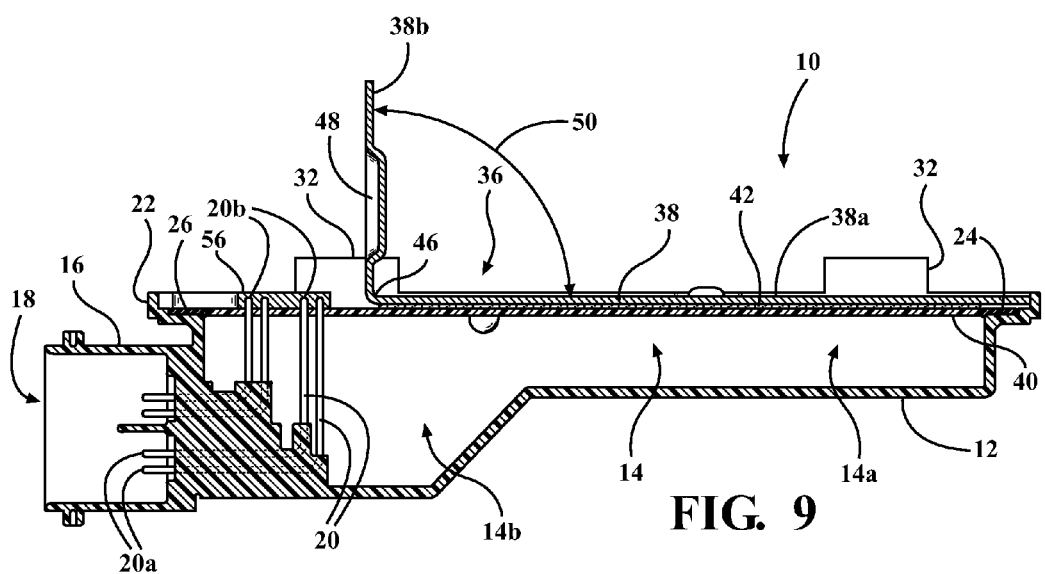
FIG. 9 is a sectional side view of an alternate embodiment of an electronic control module assembly, according to embodiments of the present invention.

An alternate embodiment of the invention is shown in FIG. 9, with like numbers referring to like elements. In this embodiment, there is a gap filler 56 which is disposed on the circuit board 40 around the second end 20b of each of the pins 20, which provides additional thermal dissipation.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
    an electronic control module, comprising:
        a housing;
        a cover having at least one portion that is movable;
        a plurality of pins; and
        a circuit board connected to part of the cover;
        wherein the plurality of pins are press-fitted into the circuit board as the cover is connected to the housing, the plurality of pins are inspected for correct positioning relative to the circuit board, and the at least one portion that is moveable is then attached to the housing.

2. The apparatus of claim 1, further comprising a connector, wherein a first end of each of the plurality of pins is part of the connector.

3. The apparatus of claim 2, the connector further comprising a shroud integrally formed as part of the housing, wherein the first end of each of the plurality of pins is disposed within the shroud.

4. The apparatus of claim 1, wherein part of the housing is molded around a portion of each of the plurality of pins.

5. The apparatus of claim 1, further comprising a cavity formed as part of the housing, wherein a portion of the pins are located in the cavity.

6. The apparatus of claim 1, further comprising a sealant disposed between the cover and the housing, such that the sealant provides a sealing function when the cover is attached to the housing.

7. The apparatus of claim 1, further comprising an adhesive, wherein the adhesive connects the cover to the circuit board.

8. The apparatus of claim 7, the cover further comprising:
    a large portion connected to the circuit board with the adhesive; and
    a small portion connected to and movable relative to the large portion;
    wherein the small portion is positioned at an angle relative to the large portion when the cover is assembled to the housing, and after the cover is assembled to the housing, the small portion is moved relative to the large portion and connected to the housing.

9. The apparatus of claim 1, each of the plurality of pins further comprising a second end, wherein the second end of each of the plurality of pins is press-fitted into the circuit board as the cover is connected to the housing.

10. The apparatus of claim 1, further comprising:
    at least one mounting feature integrally formed with the housing; and
    at least one bushing surrounded by the at least one mounting feature;
    wherein a fastener is inserted through the at least one bushing to connect the electronic control module to a vehicle.

11. An electronic module, comprising:
    a housing;
    a plurality of pins, each of the plurality of pins having a first end and a second end, a portion of the housing integrally formed around the plurality of pins;
    a circuit board;
    a cover having a first portion that the circuit board is connected to, and a second portion that is movable relative to the first portion; and
    a sealant located on a portion of the cover;
    wherein the second portion is in a first position as the cover is connected to the housing, allowing the plurality of pins to be inspected, and after the plurality of pins are inspected, the second portion is moved to a second position and connected to the housing.

12. The electronic module of claim 11, further comprising an adhesive connecting the circuit board to the first portion.

13. The electronic control module of claim 11, the connector further comprising:
    a shroud integrally formed with the housing;
    wherein the first end of each of the plurality of pins extending out of the housing and surrounded by the shroud.

14. The electronic control module of claim 13, further comprising:
    at least one mounting feature integrally formed with the housing; and
    at least one bushing surrounded by the at least one mounting feature;
    wherein a fastener is inserted through the at least one bushing to connect the electronic control module to a vehicle.

15. The electronic module of claim 11, the first portion of the cover further comprising large portion, wherein the circuit board is attached to the large portion.

16. The electronic module of claim 15, the second portion further comprising a small portion, which is bendable and connected to the housing after the position of each of the plurality of pins is inspected.

17. The electronic module of claim 11, further comprising a cavity formed as part of the housing, wherein a portion of the pins are located in the cavity.

18. An electronic control module, comprising:
    a housing;
    a cavity formed as part of the housing;
    a connector, the connector being part of the housing;

a plurality of pins, each of the plurality of pins having a first end and a second end, a portion of the housing integrally formed around the plurality of pins such that the first end of each of the plurality of pins are part of the connector, and the second end of each of the plurality of pins is located in the cavity;

a sealant;

a cover having a large portion and a small portion, the small portion bendable relative to the large portion, and the sealant is disposed between part of the cover and the housing to provide a seal between the cover and the housing;

a circuit board; and an adhesive connecting the circuit board to the large portion of the cover;

wherein the small portion of the cover is bendable relative to the large portion to allow an inspection of the plurality of pins after the plurality of pins are press-fitted into the circuit board as the large portion is connected to the housing.

19. The electronic control module of claim 18, the connector further comprising:

a shroud integrally formed with the housing;

wherein the first end of each of the plurality of pins extends out of the housing such that the first end of each of the plurality of pins is substantially surrounded by the shroud.

20. The electronic control module of claim 18, further comprising:

at least one mounting feature integrally formed with the housing; and at least one bushing surrounded by the at least one mounting feature;

wherein a fastener is inserted through the at least one bushing to connect the electronic control module to a vehicle.

21. The electronic control module of claim 18, wherein each of the plurality of pins is configured such that the first end of the plurality of pins is about ninety degrees relative to the second end of each of the plurality of pins.

* * * * *